United States Patent [19]

Yamaguchi et al.

[11] Patent Number: 4,569,885
[45] Date of Patent: Feb. 11, 1986

[54] POLYESTER FILM FOR FORMING PRINTED CIRCUIT

[75] Inventors: Katsuhiko Yamaguchi; Seiki Kobayashi; Yasufumi Miyake; Akio Tsumura, all of Osaka, Japan

[73] Assignee: Nitto Electric Industrial Company, Limited, Osaka, Japan

[21] Appl. No.: 651,122

[22] Filed: Nov. 19, 1984

Related U.S. Application Data

[63] Continuation of Ser. No. 409,788, Aug. 20, 1982, abandoned.

[30] Foreign Application Priority Data

Aug. 20, 1981 [JP] Japan ................................. 56-131293

[51] Int. Cl.$^4$ ...................... B32B 27/06; B29C 25/00
[52] U.S. Cl. .................................... 428/339; 428/480; 428/483; 428/910; 264/176 R; 264/346
[58] Field of Search ............... 428/480, 483, 910, 339; 264/346

[56] References Cited

U.S. PATENT DOCUMENTS 3,669,931  6/1972  Annis et al. ........................ 264/346
3,962,520  6/1976  Watanabe et al. .............. 428/480 X

FOREIGN PATENT DOCUMENTS 0165693  12/1980  Japan ................................. 428/480

Primary Examiner—Patricia C. Ives
Attorney, Agent, or Firm—Sughrue, Mion, Zinn, Macpeak & Seas

[57] ABSTRACT

A polyester film for printed circuits to be used as a base in a printed circuit base plate or as a base and/or cover layer in a printed circuit board, which undergoes a degree of dimensional stability of not more than 1% in both the longitudinal and transverse directions when kept at 150° C. for 30 minutes, and which is obtained by heat treating an extrusion molded and stretched polyester film at 150° C. to 240° C. without applying tension.

2 Claims, No Drawings

POLYESTER FILM FOR FORMING PRINTED CIRCUIT

This is a continuation of application Ser. No. 409,788, filed 8/20/82 now abandoned.

FIELD OF THE INVENTION

This invention relates to a polyester film which permits soldering for use in forming printed circuits.

BACKGROUND OF THE INVENTION

Printed circuit base plates generally comprise a resinous base having provided thereon a metal foil, such as copper foil, via a heat resistant adhesive layer, and printed circuit boards are obtained by forming a predetermined wiring pattern in the metal foil.

A printed circuit board with a cover layer is obtained by providing a resinous cover layer on the wiring pattern-formed metal foil via a heat resistant adhesive layer.

As the resinous base and cover layer used in a printed circuit base plate or printed circuit board as described above, polyimide films, polyparabanic acid films, extremely thin glass epoxy plates, etc., are popularly used. These heat resistant materials provide circuit boards having high accuracy and high quality. However, they have the defect that they are inferior to polyester film in humidity resistance and water resistance, and are thus somewhat poor in general purpose properties.

Polyester films have recently come into use as a base or cover layer for printed circuits in place of the above heat resistant materials due to their inexpensiveness and comparatively good humidity and water resistance. However, polyester films have the serious defect that they are liable to shrink when heated. Thus, when they are subjected to a high temperature treatment, such as soldering, the base plate or circuit board comprising the polyester film is liable to shrink and form warps and voids between the metal foil and the base, rendering the same unable to be used in forming highly accurate circuit boards. In fact, even where high accuracy is not required, high temperature treatment of a circuit board comprising a polyester is undesirable, and the use of such circuit boards is limited to situations where the polyester is used in only small or narrow portions so that the possible formation of voids causes no practical problem on heating, for example, by using a soldering bit.

Commercially available polyester films are generally manufactured by melting a polyester resin, extrusion molding it by, for example, an inflation method, and mono- or biaxially stretching to increase its mechanical properities such as tensile strength, initial modulus, impact strength, etc. The high heat shrinkage of the polyester film results from the fact that it undergoes molecular orientation in the above manufacturing steps, which is liable to generate internal stress.

SUMMARY OF THE INVENTION

As a result of intensive investigations to obtain a polyester film which overcomes the above defects, which sufficiently resists high temperature treatments, such as roll soldering, and which can be applied to a printed circuit board with comparatively high accuracy, the inventors found that the heat shrinkage of a commercially available polyester film can be remarkably reduced by subjecting it to a specific heat treatment procedure, whereby it becomes suitable for use in forming printed circuit boards.

DETAILED DESCRIPTION OF THE INVENTION

The present invention relates to a polyester film for printed circuits to be used as a base in a printed circuit base plate or as a base and/or cover layer in a printed circuit board, which polyester film shows a degree of dimensional stability of not more than 1% in both the longitudinal and transverse directions when kept at 150° C. for 30 minutes, and which is obtained by heat treating an extrusion molded and stretched polyester film at 150° to 240° C. without applying tension thereto.

When an extrusion molded and stretched polyester film, which can be a commercially available polyester film, is heat treated without applying tension as is mentioned above, most heat shrinkage takes place during this heat treatment. As a result, even when the same subjected to high temperature heat treatment (e.g., a roll soldering temperature of about 190° to 240° C.) at a temperature higher than the above heat treatment, the polyester film undergoes remarkably reduced shrinkage, and is thus suited for use in printed circuit boards.

The heat treatment employed in the present invention is conducted in air at ambient temperature.

Commercially available polyester films are known which have been heat treated after extrusion molding and stretching. However, such heat treatment is conducted while applying a definite tension in the longitudinal and transverse directions for the purpose of removing wrinkles in the stretched film. Heat shrinkage is depressed to some extent by such treatment at temperatures lower than the heat treating temperature, but the degree of heat shrinkage depression is much smaller than that achieved by the heat treatment of the present invention. In addition, heat shrinkage properties are rather increased at the heat treating temperature or higher, and it is usually a secondary object of the conventional heat treatment to increase the heat shrinking properties. Therefore, polyesters subjected to such conventional heat treatments are more unsuitable for use in forming printed circuit boards.

In contrast, the heat treatment of the present invention reduces the degree of dimensional stability to 1% or less than that in both longitudinal and transverse directions at 150° C. for 30 minutes. Polyester films having such properties shrink only 0.5% or less when subjected to a total surface high temperature treatment, such as roll soldering, at 190° to 240° C. for 1 second or longer, usually up to 5 seconds, causing no warps and voids as are encountered with conventional polyester films. Accordingly, the polyester film of the present invention can be satisfactorily applied in uses requiring comparatively high accuracy, i.e., as a substitute for a polyimide film or polyparabanic acid film, as well as uses requiring not so high accuracy. Thus, films industrially advantageous in price and resistance to humidity and water are provided.

Extrusion molded and stretched films used in the present invention are those which are obtained by extrusion molding and stretching (usually biaxial stretching) polyester resin at a stretching ratio of about 3 to 4 in a conventional manner, and include commercially available Lumirror film (trade name of a product manufactured by Toray Industries, Inc.), Mylar film (trade name of a product manufactured by Du Pont de Nemours & Co., Inc.), etc.

Typical examples of extrusion molded and stretched films are polyethylene terephthalate films such as the above described commercially available products. The polyethylene terephthalate films have the weight average molecular weight of about 8,000 or more, preferably about 22,000 to 27,000 (corresponding to an inherent viscosity [η] of about 0.55 to 0.65). The thickness of these films used as a base and/or cover layer is usually about 6 to about 350μ.

The extrusion molded and stretched film is heat treated while applying thereto no tension. The heat treating temperature is set at 150° to 240° C. The higher the heat treating temperature within this range, the more the effects of the present invention. If the heat treating temperature is lower than 150° C., insufficient effects result from the heat treatment, whereas if higher than 240° C. the temperature nears the softening point of the film, such temperatures being unsuitable.

Heat treating time varies depending upon the heat treating temperature and heat treating means; for example, in the case of leaving the film in a heating drier, the heating time is generally 30 to 60 minutes and, in the case of passing the same between hot rolls, it is usually 5 to 600 seconds.

This heat treatment causes a change in the crystalline structure of the film and, as a result, there appear physical changes such as a reduction in heat welding properties and an increase in refractive index in the thickness direction. With a polyethylene terephthalate film, for example, the refractive index of the film in the thickness direction before heat treatment is not more than 1.4980 (measured by means of an Abbe refractometer), and it increases to more than 1.4990, usually 1.4995 to 1.5020, after heat treatment.

The thus obtained polyester film of the present invention for printed circuits is characterized in that it undergoes a degree of dimensional stability of not more than 1% in both the longitudinal and transverse directions at 150° C. for 30 minutes. In using this film for preparing printed circuits, a heat resistant adhesive layer is generally formed on one side thereof. As the adhesive layer, any conventionally known ones can be used; for example, there are illustrated Vylon-300S (polyester resin made by Toyo Spinning Co., Ltd.), thermosetting epoxy resins, thermosetting polyacrylic ester copolymer compositions, etc.

The polyester film of the present invention for printed circuits may be used as a base or a cover layer, or as both a base and cover layer in another embodiment of a printed circuit board. In addition, it can be used as a base in a printed circuit base plate. In every embodiment, the aforesaid effects of the present invention are obtained.

In the case of the polyester film being used as a base, the aforesaid heat resistant adhesive layer is formed thereon, and a metal foil is adhered to the adhesive layer to prepare a base plate for forming a flexible printed circuit in a conventional manner. A predetermined wiring pattern is formed on this base plate by etching, plating, or the like in a conventional manner to prepare a printed circuit board.

In the case of providing a cover layer on the circuit board, the polyester film of the present invention, or a known heat resistant film, such as a polyimide film or a polyparabanic acid film, is preferably used as the cover layer.

On the other hand, in the case of the polyester film being used as a cover layer, a predetermined wiring pattern is formed in a conventional manner on the metal foil provided on a heat resistant flexible base of an ordinary polyimide film or polyparabanic acid film, or on a hard plate composed of a heat resistant material as mentioned above or on a conventional polyester film, followed by adhering thereon the polyester film of the present invention via the aforesaid heat resistant adhesive layer.

The present invention will now be described in more detail by the following non-limiting examples of preferred embodiments of the present invention. The refractive index in the thickness direction was measured in a conventional manner using an Abbe refractometer (Model 1), a sodium light source, a test piece of a 1.7400 refractive index, using monobromonaphthalenecarboxylic acid as the interlayer (intermediate liquid for tightly contacting test piece and prism), and using an ocular micrometer having a polarizing plate.

EXAMPLE 1

A 75μ thick Lumirror film (a commercially available polyethylene terephthalate film described hereinbefore) was maintained in a tension free state for 30 minutes in a 240° C. drier to conduct the heat treatment. The refractive index of the film in the thickness direction before heat treatment was 1.4975 and after heat treatment was 1.4997. The film underwent, before being heat treated, a degree of dimensional stability of 1.5% in the longitudinal direction and 0.4% in the transverse direction when kept at 150° C. for 30 minutes, and underwent, after being heat treated, a degree of dimensional stability of 0.15% in the longitudinal direction and 0.1% in the transverse direction when kept at 150° C. for 30 minutes.

A heat resistant adhesive solution was then applied to one side of the film in a dry thickness of 20μ using an applicator and the composite dried at 120° C. for 5 minutes to obtain a polyester film of the present invention having a heat resistant adhesive layer. As the heat resistant adhesive layer solution, a toluene solution (30 wt % solids) prepared by dissolving Vylon-300S (polyester resin made by Toyo Spinning Co., Ltd.) in toluene and uniformly mixing the solution with 5 parts by weight, per 100 parts by weight of the resin, of Coronate L (polyfunctional isocyanate compound made by Nippon Polyurethane Co.) was used.

A copper foil was then superposed on the adhesive layer of the thus obtained polyester film having the heat resistant adhesive layer, and the assembly was heat pressed at 150° C. to prepare a base plate for making printed circuits. After forming a wiring pattern in the copper foil of the base plate in a conventional manner, it was subjected to roll soldering for 1 second using a 240° C. bath of molten solder to deposit solder all over the remaining copper foil. The degree of dimensional stability of the polyester film during this circuit forming process was 0.05%; no warps and voids were observed. In fact, no warps and voids were formed even when the circuit was partly re-heated at 260° C. for 1 second.

When the roll soldering conditions were changed to 240° C. for 5 seconds, the degree of dimensional stability was 0.15%. In this case, warps and voids were scarcely formed upon roll soldering and upon subsequent re-heating.

On the other hand, when a base plate sample for forming printed circuits obtained in the same manner as described above except for omitting the heat treatment was subjected to roll soldering at 240° C. for 1 second after forming therein the wiring pattern, there resulted a degree of dimensional stability of as high as 0.8%, and warps and voids formation became serious during processing, desired circuit boards thus not being obtained.

COMPARATIVE EXAMPLE

In the same manner as in Example 1 except for applying a tension of 10 kg/cm$^2$ in both the longitudinal and transverse directions during heat treatment, there was obtained a polyester film having a heat resistant adhesive layer. A base plate for forming printed circuits and a printed circuit board were prepared by the same procedure as in Example 1 except for using the resulting polyester film having an adhesive layer. The degree of dimensional stability of the film upon roll soldering in circuit board formation was as high as 1.0%, and many warps and voids were formed during the process; thus, a practically usable printed circuit board could not be obtained.

EXAMPLE 2

In the same manner as in Example 1 except for changing the heat treating conditions in the heating drier to 150° C. for 30 minutes, there was obtained a polyester film of the present invention having a heat resistant adhesive layer. This film had a refractive index of 1.4992 in the thickness direction before formation of the heat resistant adhesive layer, and underwent a degree of dimensional stability of 0.2% in the longitudinal direction and 0.15% in the transverse direction when kept at 50° C. for 30 minutes.

Subsequent procedures were conducted in the same manner as in Example 1 using the thus obtained polyester film having a heat resistant adhesive layer to prepare a base plate for forming printed circuits. After forming a predetermined circuit pattern on this base plate, the whole surface of the base plate was subjected to roll soldering at 200° C. for 1 second. The degree of dimensional stability of the film during this circuit forming process was 0.20%, and no warps and voids were observed during the process. Further, even when the pattern was partly re-heated at 260° C. for 1 second, no warps and voids were formed.

EXAMPLE 3

In the same manner as in Example 1 except for using hot rolls as the heating means and heat treating at 240° C. for 60 seconds, there was obtained a polyester film of the present invention having a heat resistant adhesive layer thereon. This film had a refractive index of 1.4995 in the thickness direction before formation of the heat resistant adhesive layer, and underwent a degree of dimensional stability of 0.20% in the longitudinal direction and 0.10% in the transverse direction when kept at 150° C. for 30 minutes.

Subsequent procedures were conducted in the same manner as in Example 1 using the thus obtained polyester film having the heat resistant adhesive layer to prepare a base plate for forming printed circuits. After forming a predetermined circuit pattern on this base plate, the whole surface of the base plate was subjected to roll soldering at 240° C. for 5 seconds. The degree of dimensional stability of the film during this circuit forming process was 0.15%, and no warps and voids were observed during the process. Further, even when the pattern was partly re-heated at 260° C. for 1 second, no warps and voids were formed.

EXAMPLE 4

In the same manner as in Example 3 except for heat treating at 150° C. for 5 seconds, there was obtained a polyester film of the present invention having a heat resistant adhesive layer. This film had a refractive index of 1.4991 in the thickness direction before formation of the heat resistant adhesive layer, and underwent a degree of dimensional stability of 0.22% in the longitudinal direction and 0.17% in the transverse direction when kept at 150° C. for 30 minutes.

Subsequent procedures were conducted in the same manner as in Example 1 using the thus obtained polyester film having a heat resistant adhesive layer to prepare a base plate for forming printed circuits. After forming a predetermined circuit pattern on this base plate, the whole surface of the base plate was subjected to roll soldering at 240° C. for 1 second. The degree of dimensional stability of the film during this circuit forming process was 0.5%, and no warps and voids were observed during the process. Further, even when the pattern was partly re-heated at 260° C. for 1 second, no warps and voids were formed.

EXAMPLE 5

The heat treatment was conducted under the same conditions and procedures as in Example 1 except for using a 125μ thick Lumirror film (commercially available polyethylene terephthalate film described hereinbefore) in place of 75μ thick Lumirror film. This film had a refractive index of 1.4964 in the thickness direction before being heat treated and had a refractive index of 1.4998 after being heat treated, and it underwent, before being heat treated, a degree of dimensional stability of 1.5% in the longitudinal direction and 0.5% in the transverse direction when kept at 150° C. for 30 minutes and underwent, after being heat treated, a degree of dimensional stability of 0.3% in the longitudinal direction and 0.2% in the transverse direction. On the thus heat treated film there was formed a heat resistant adhesive layer in the same manner as in Example 1.

Subsequent procedures were conducted in the same manner as in Example 1 using the thus obtained polyester film having a heat resistant adhesive layer to prepare a base plate for forming printed circuits. After forming a predetermined circuit pattern on this base plate, it was subjected to roll soldering at 240° C. for 1 second. The degree of dimensional stability of the film during this circuit forming process was 0.06%, and no warps and voids were observed during the process. Further, even when the pattern was partly re-heated at 260° C. for 1 second, no warps and voids were formed.

On the other hand, when a base plate for forming printed circuits prepared in the same manner as described above except for omitting the heat treatment was used to form a wiring pattern and subjected to roll soldering at 240° C. for 1 second, it underwent a degree of dimensional stability of as high as 1.2% upon roll soldering, during which warps and voids formation became so serious that the desired circuit board could not be obtained.

EXAMPLE 6

A predetermined circuit pattern was formed on a copper foil laminated plate, Pyralux (trade name; made by Du Pont de Nemours & Co., Inc.) [printed circuit base plate comprising a 25μ thick polyimide film (the degree of heat shrinkage at 150° C., 2 hours of 0.04% in the machine direction and 0.06% in the transverse direction) having adhered thereon a copper foil], and the polyester film having a heat resistant adhesive layer obtained in Example 1 was heat adhered onto the pattern so that the circuit pattern was partly laid bare to prepare a printed circuit board having a cover layer.

This circuit board was then subjected to roll soldering for 1 second using a 220° C. bath of molten solder to thereby deposit solder on the copper foil in bare portions. The degree of dimensional stability of the polyester cover layer in this roll soldering treatment was 0.03%, and no warps and voids (between the copper foil and the cover layer) were observed. Further, even when the pattern was partly re-heated at 240° C. for 1 second, no warps and voids were formed.

On the other hand, a Lumirror film which was not heat treated was used as a cover layer in place of the polyester film obtained in Example 1, and the same was heat adhered onto a copper foil subjected to the same treatment for forming a circuit pattern as described above via a heat resistant adhesive layer. When the resulting circuit board was subjected to the same roll soldering and re-heating treatment as described above, warps and voids due to the cover layer were observed so much that there was not obtained a highly accurate printed circuit board having a cover layer.

EXAMPLE 7

The copper foil of the printed circuit base plate comprising the polyester film of the present invention obtained in Example 1 was subjected to a treatment for forming a wiring pattern by, for example, a conventional etching, and then the polyester film having a heat resistant adhesive layer obtained in Example 1 was heat pressed onto the copper foil so that part of the pattern was laid bare to form a printed circuit board having a cover layer thereon.

This printed circuit board was then subjected to roll soldering for 1 second using a 220° C. bath of molten solder to thereby deposit solder onto the copper foil in bare portions. The degree of dimensional stability of the film in roll soldering treatment was 0.04%, during which no warps and voids (between the copper foil and the base or cover layer) were observed. When the circuit board was partly re-heated at 240° C. for 1 second to re-flow the solder, there were observed no voids and warps.

While the invention has been described in detail and with reference to specific embodiments thereof, it will be apparent to one skilled in the art that various changes and modifications can be made therein without departing from the spirit and scope thereof.

What is claimed is:

1. A polyester film for printed circuits to be used as a base in a printed circuit base plate or as a base and/or cover layer in a printed circuit board, which undergoes a degree of dimensional stability of not more than 1% in both the longitudinal and transverse directions when kept at 150° C. for 30 minutes, and which is obtained by heat treating an extrusion molded and stretched polyester film at 150° C. to 240° C. without applying tension, wherein said extrusion molded and stretched film is a polyethylene terephthalate film, and wherein said polyester film has a refractive index of 1.4990 or more, measured by an Abbe refractometer, in the thickness direction.

2. The polyester film for forming printed circuits as claimed in claim 1, which has a heat resistant adhesive layer on one side thereof.

* * * * *